United States Patent [19]
Iannuzo

[11] Patent Number: 5,235,489
[45] Date of Patent: Aug. 10, 1993

[54] INTEGRATED SOLUTION TO HIGH VOLTAGE LOAD DUMP CONDITIONS

[75] Inventor: James M. Iannuzo, Phoenix, Ariz.

[73] Assignee: SGS-Thomson Microelectronics, Inc., Carrollton, Tex.

[21] Appl. No.: 724,537

[22] Filed: Jun. 28, 1991

[51] Int. Cl.⁵ .............................................. H02H 9/04
[52] U.S. Cl. ...................................... 361/56; 361/111; 361/91; 257/356
[58] Field of Search ............................ 361/56, 91, 111; 357/23.13

[56] References Cited

U.S. PATENT DOCUMENTS

| | | | |
|---|---|---|---|
| 4,578,695 | 3/1986 | Delaporte et al. | 361/91 |
| 4,775,912 | 10/1988 | Menniti et al. | 361/56 |
| 4,896,243 | 1/1990 | Chatterjee et al. | 361/56 |
| 4,949,212 | 8/1990 | Lenz et al. | 361/56 |
| 5,032,742 | 7/1991 | Zandera | 361/91 |

FOREIGN PATENT DOCUMENTS

0226469A1 6/1987 European Pat. Off.
2092377A 8/1982 United Kingdom.

Primary Examiner—Todd E. DeBoer
Attorney, Agent, or Firm—Richard A. Bachand; Lisa K. Jorgenson; Richard K. Robinson

[57] ABSTRACT

A structure for protecting an integrated circuit against high supply line voltages is formed in an epitaxial silicon layer of one conductivity type on a semiconductor substrate of another conductivity type. A transistor is formed in the epitaxial layer to protect the integrated circuit against low range overvoltages. A highly doped region in the epitaxial layer on one side of the transistor of the same conductivity type as the expitaxial layer extends to the substrate. The highly doped region is connected to a reference potential and establishes a parasitic SCR with the transistor and substrate with a controllable breakover voltage above the protection voltage of the transistor.

17 Claims, 1 Drawing Sheet

2

INTEGRATED SOLUTION TO HIGH VOLTAGE LOAD DUMP CONDITIONS

BACKGROUND OF THE INVENTION

1. Field of the Invention

This invention relates broadly to improvements in semiconductor integrated circuits, and more particularly to improvements in high supply voltage protection for integrated circuits, and still more particularly to improvements in high voltage protection for integrated circuits intended for use in environments such as in automotive applications, and to methods for achieving such protection.

2. Description of the Prior Art

Integrated circuits, and particularly integrated circuits used in automotive applications, are often required to withstand potentially destructive high voltage power supply transients which are greater in amplitude than those normally encountered. For example, in automotive applications, high voltage power supply transients often occur on the battery line which are significantly higher than the normal DC operating voltages of the alternator of a car or other vehicle in which they are employed. This is especially true for integrated circuits which are powered directly from the battery line. These high voltage battery line transients are often referred to as "load dumps". A "load dump" may occur, for example, in the event that the battery becomes temporarily disconnected from the electrical circuit of an automobile of which the motor and alternator system is operating.

In general, it has been assumed that the fabrication process for an integrated circuit of particular use would define a maximum load dump voltage in terms of the breakdown voltage designs of the process, and, typically, integrated circuits sold, for instance to automotive companies, are tested to insure they meet the required breakdown voltage requirements necessary to survive preestablished load dumps. It will be apparent that each particular application will determine the peak voltage and total allowable energy transfer which can be delivered to the integrated circuit. For instance, one such low voltage (60 volts) test which may typically be used is shown in FIG. 1.

As shown, a test circuit 10 has two current loop paths 11 and 12. The first current loop path 11 includes a 60 volt power supply 15, which charges a capacitor 16 through a current limiting resistor 18, when switch 19 is in a first position.

When the switch 19 is switched to a second position, the capacitor 16 is connected into the second current loop 12 to discharge the energy stored on it into the second current loop 12. The second current loop 12 includes a second power supply 21, connected in parallel with the capacitor 16 via a diode 22. The current flows through a resistor 25 to the device under test 26. A second resistor 28 is connected in parallel with the device under test, across which the supply voltage and transient voltages are developed.

Thus, in operation, the voltage provided by the second power supply 21 and diode 22 emulates the steady state voltage, for example provided by an automotive alternator. When the energy stored upon the capacitor 16 is delivered into the second current path 12 upon switching the switch 19, the normal voltage and transient energy are developed across resistor 28 and applied to the device under test 26.

In such 60 volt load dump testing, it can be seen that the process must be designed to produce parts which have a breakdown voltage sufficiently high to assure part survivability. This is usually not a problem in processes for making power integrated circuits. However, absorbing the load dump energy for the 60 volt case is not practical, due to the small source impedance seen by the device under test. A simple calculation shows that the energy stored in the capacitor is $\frac{1}{2}CV^2$. Under these circumstances, it is apparent that the process can be designed easily to insure that junction breakdown will not occur.

The problem arises, however, when the load dump voltage rises to a value above the breakdown voltage designed in the process to a level at which the junction will break down, typically between 70 volts and 120 volts. Thus, at those voltage levels, if a load dump of high enough energy were to be applied to the circuit, internal junction breakdown would occur. It should be noted that although this junction breakdown is in itself not destructive, the heating effects related to the breakdown can be destructive, and unless the source impedance seen by the device is large, destruction will likely occur. Furthermore, the ability to control which junctions absorb the high voltage load dump energy is unpredictable.

SUMMARY OF THE INVENTION

In view of the above, it is, therefore, an object of the invention to provide high voltage load dump protection for an integrated circuit.

It is a further object of the invention to provide load dump protection for an integrated circuit which can be controlled over the temperature ranges of concern to the operation to the integrated circuit.

It is another object of the invention to provide an integrated circuit device which is capable of bypassing the large currents associated with high voltage load dumps.

It is still another object of the invention to provide high voltage load dump protection for an integrated circuit which requires little chip area and can be economically fabricated.

These and other objects, features, and advantages can be appreciated by those skilled in the art from the embodiment of the present invention disclosed in the following detailed description, accompanying drawing and appended claims.

In accordance with a preferred embodiment of the invention, a structure for protecting an integrated circuit against high supply line voltages is formed in an epitaxial silicon layer of one conductivity type on a semiconductor substrate of another conductivity type. A parasitic transistor is formed in the epitaxial layer to protect the integrated circuit against low range overvoltages. A highly doped region in the epitaxial layer on one side of the transistor of the same conductivity type as the expitaxial layer extends to the substrate. The highly doped region is connected to a reference potential and establishes a parasitic SCR with the transistor and substrate with a controllable breakover voltage above the protection voltage of the transistor.

The structure, according to a preferred embodiment of the invention, is supplemental to the 60 volt dump protection capabilities provided during the normal integrated circuit design, and is intended to provide protection when the process protection would otherwise fail. The device structure provides high voltage positive load dump protection, for example up to about 450 volts. Also, the maximum currents seen by the device under test are limited by a greater source impedance.

As mentioned, in the past, it has been assumed that the fabrication process for an integrated circuit of particular use would define a maximum load dump voltage in terms of the breakdown voltage designs of the process. While this is generally true, it is nevertheless possible, in accordance with the present invention, to introduce a circuit including a parasitic device into the integrated circuit which is capable of absorbing substantially all of the high voltage load dump energy.

DESCRIPTION OF THE DRAWINGS

The invention is illustrated in the accompanying drawings, in which.

Figure 1:
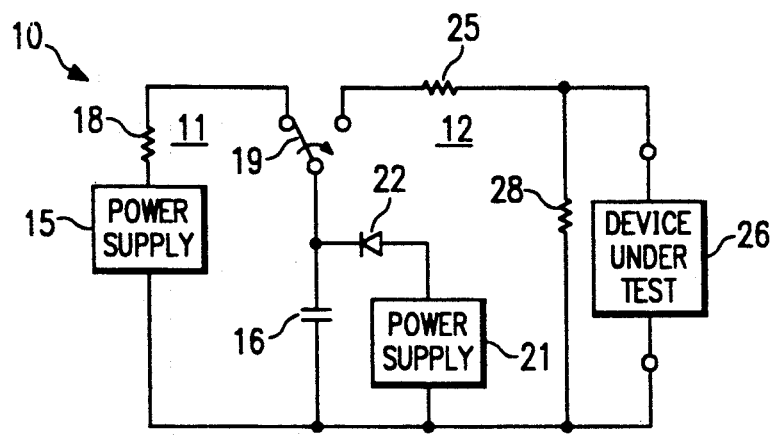
FIG. 1 is an electrical schematic diagram of a circuit for testing the voltage breakdown of an integrated circuit, in accordance with known testing techniques.

In the various Figures of the drawings, like reference numerals are used to denote like or similar parts. Also, the sizes and dimensions have been exaggerated or distorted for clarity of illustration and ease of description. Also, in the drawings, certain parasitic devices are shown, denoted by reference numerals in parenthesis.

DETAILED DESCRIPTION OF THE PREFERRED EMBODIMENT

Figure 2:
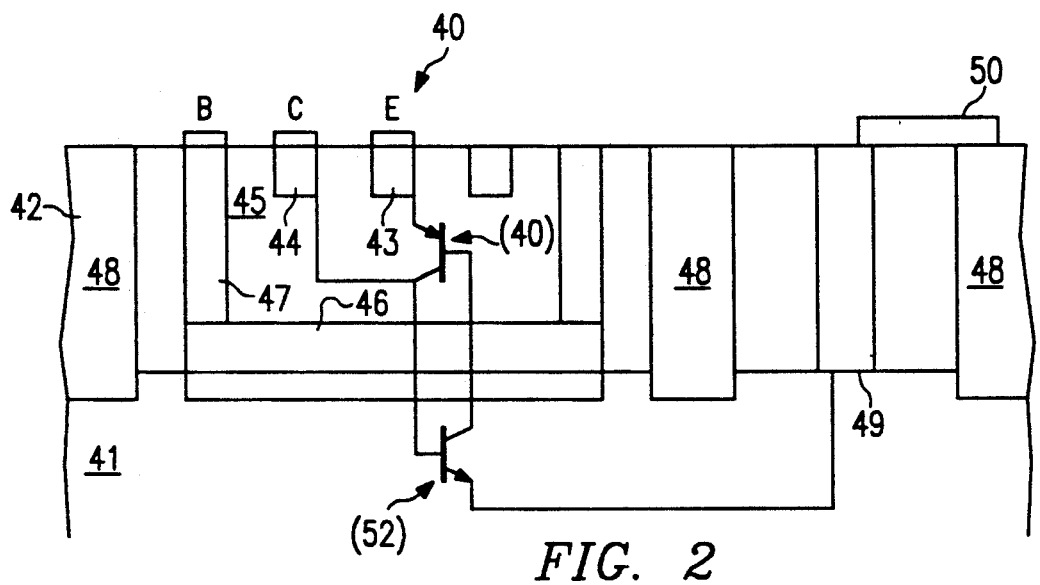
FIG. 2 is a cross sectional side view of a portion of an integrated circuit chip, showing a preferred embodiment of the invention.
Figure 3:
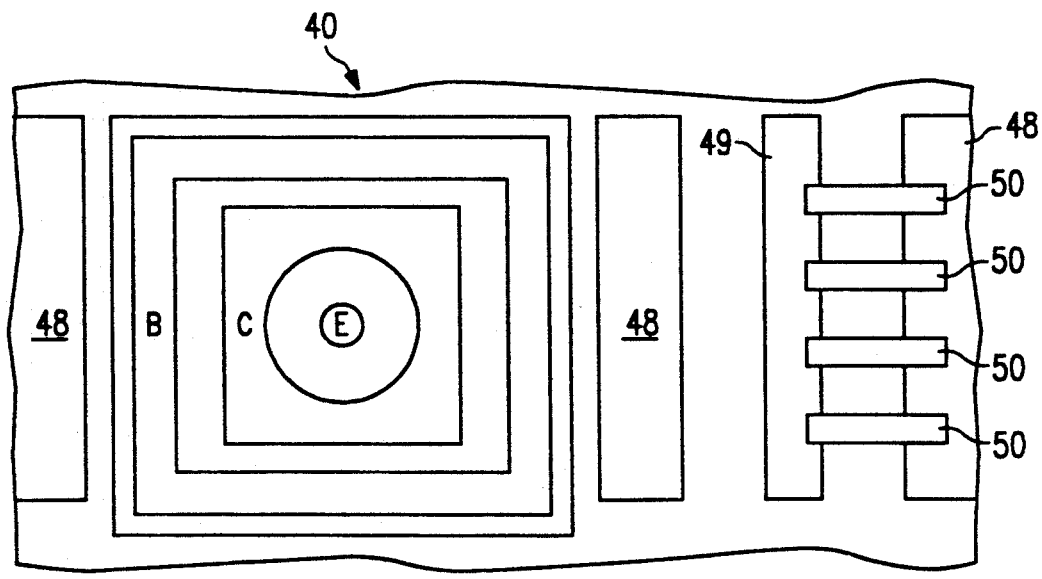
FIG. 3 is a plan view of the integrated circuit chip of FIG. 2.

The invention, described with reference to FIGS. 2 and 3, is intended for use in combination with known integrated circuits, particularly, but without limitation thereto, to integrated circuits designed primarily for automotive applications. The integrated circuits themselves are not material to the invention, except as otherwise noted, and are not described in detail herein.

It is also noted that although the description of the invention is made with reference to device features and structures of particular semiconductor conductivity types, it not intended to limit the invention thereto. Those skilled in the art will recognize, for example, that features or transistor structures of opposite or different conductivity type can be equally advantageously employed. Thus, the integrated circuit with which a preferred embodiment of this invention as herein described is constructed in an epitaxially formed silicon layer 42 of N-conductivity type on a silicon substrate 41 of P conductivity type.

As noted hereinabove, ordinarily in the process for manufacture of an integrated circuit intended for uses in which the circuit may be exposed to load dumps, such as in automotive environments, PNP transistors normally exist in the circuit. In the event such transistor does not exist, one can easily be fabricated. Thus, in accordance with a preferred embodiment of the invention, a PNP transistor may be defined for use specifically in conjunction with the load dump circuitry described herein. To serve this purpose, therefore, a parasitic PNP transistor (40) is located in the substrate 41 of the integrated circuit chip. One example of such PNP transistor has its emitter 43 of P type material connected to a DC potential (not shown), such as, for example, a battery terminal, for instance, in automotive applications. The collector 44 of P type material is formed in a tank of N− type epitaxial silicon surrounded by the base region provided by the N− type epitaxial tank 45. It is noted that the base also includes buried layer 46 and ring 47 of highly conductive N+ type material. Surface contacts are provided to the collector 44 and the base components 46 and 47. The base of the transistor extends to the substrate 41, which may be connected to ground or reference potential. The PNP transistor 40, thus constructed can be designed to have a breakdown voltage of between 60 and 100 volts.

The lateral sides of the PNP transistor 40 are surrounded by a highly conductive isolation region 48 which serves to isolate the PNP transistor from the remaining portions of the circuit (not shown). Such isolation regions are well known in the art.

In accordance with the invention, once the PNP transistor 40 is located on the integrated circuit chip, an N+ barrier 49 is located, to be formed on one side of the PNP transistor 40, for example, on a side of the conductive isolation region 48 away from the PNP transistor 40. The N+ region has substrate contacts connected to it with no direct metal path to ground; for example by connection 50 the conductive isolation region 48, by surface wiring or interconnect techniques, well known in the art. The N+region is of dimensions sufficient to achieve the objects of the invention, which will depend upon the various dimensions, device spacings, process parameters, and so forth, but can be easily determined by a test wafer.

The N+ region, in conjunction with the substrate and the elements of the PNP transistor 40 basically form a parasitic SCR. More specifically, a parasitic NPN transistor (52) (shown in the schematic diagram superimposed on the cross-sectional side view in FIG. 2) is established with the P type substrate 41 providing the base, the base of the PNP transistor 40 providing the collector, and the N+ region 49 providing the emitter. Thus, the parasitic NPN transistor (52), in conjunction with the PNP transistor 40 form the parasitic SCR.

Figure 4:
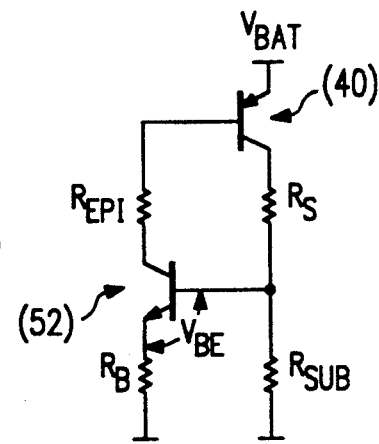
FIG. 4 is a schematic diagram of an equivalent electrical circuit of the structure of FIGS. 2 and 3.

The equivalent circuit of the parasitic SCR 55 is shown in more detail in FIG. 4. The resistances shown in the circuit represent, respectively, $R_{SUB}$ (a relatively large resistance), which is the resistance of the substrate between the base of the parasitic NPN transistor (52) and ground, or a reference potential; $R_B$ (a relatively small resistance), which is the lateral resistance of the substrate 41 between the base of the PNP transistor 40 and the N+ barrier region 49; $R_{EPI}$, which is the resistance of the tank of epitaxial layer 42 forming a part of the base of the PNP transistor 40; and $R_S$, which is the resistance between the collector of the PNP transistor 40 and the substrate 41 forming the base of the parasitic transistor (52).

In operation, under load dump conditions, the emitter of the PNP transistor 40 will be forced to the peak applied load dump voltage, since it is connected directly the battery line. The base of the PNP transistor 40 will be dragged 1 $V_{BE}$ below the emitter, thus turning on the PNP transistor 40. Since the substrate 41, acting as the collector of the parasitic NPN transistor (52), is tied to ground, or reference potential, the parasitic NPN transistor (52) operates in a linear mode.

It can therefore be seen that the device structure provides high voltage positive load dump protection, for example up to about 450 volts. Such high voltages can be easily handled by the circuitry, because the energy associated with these high voltage dumps is less than would be seen, for example in the 60 volt dump situations. Also, the maximum currents seen by the device under test are limited by a greater source impedance ($R_s$ is increased in value during high voltage load dumps.)

It should be appreciated that normally, precautions are taken to minimize the effects of any parasitic PNP transistors which may be formed during manufacturing processes. For example, a full "sinker ring" 47 and buried layer 46, as described above, have been added to the base of the PNP transistor 40 for this purpose. That is, these highly doped regions cause recombination of injected emitter majority carriers to occur to insure that the gain of any parasitic device is low, at least in the lower 60 volt range.

On the other hand, at higher overvoltages, the effect of the highly doped base regions 46 and 47 becomes less significant due to expanding depletion regions which enable substrate currents to flow. However, the parasitic NPN transistor (52) will turn on when the substrate goes 1 $V_{BE}$ above the barrier potential of the N+ region 49. Due to the low resistance the isolation region 48, it provides a better connection to ground, or reference potential, than if it were connected directly to the substrate 41. Thus, as current flow in the highly resistive substrate 41, the current reaches a point where the substrate 41 becomes forward biased with respect to the N+ region 49. Since the N+ region 49 is directly connected to the low resistance isolation region 48, it is tied directly to ground or reference potential. On the other hand, if the N+ region 49 barrier were to be hard wired to a ground pad with metal, then, the breakover voltage, $V_{so}$, (the voltage at which the parasitic SCR begins to conduct) of the parasitic SCR would be decreased.

The parasitic SCR action is initiated when the parasitic NPN transistor turns on, thereby passing the large currents associated with the load dump to ground, or reference potential. Junction sizing and metal trace current densities should be taken into account due to the large amounts of energy transferred into the parasitic SCR. Accordingly, with the parasitic SCR constituted as described, it can be appreciated that once the parasitic SCR action has commenced, the rest of the integrated circuit is protected due to the clamping nature of the parasitic SCR.

Another advantage of the circuit according to the preferred embodiment of the invention is that the parasitic SCR has little variation in $V_{so}$ with variations in temperature. This is due, at least in part, to the negative feedback introduced by $R_B$. This is an important benefit because it provides the designer the ability to control the parasitic SCR over wide temperature ranges.

Although the invention has been described and illustrated with a certain degree of particularity, it is understood that the present disclosure has been made by way of example only, and that numerous changes in the combination and arrangements of parts and features can be made by those skilled in the art without departing from the spirit and scope of the invention, as hereinafter claimed.

I claim:

1. A structure for protecting an integrated circuit against high supply line voltages, comprising:
    a semiconductor substrate of first conductivity type and a semiconductor layer of epitaxial silicon of second conductivity type on said substrate;
    a highly doped region in said epitaxial silicon for establishing a parasitic device having a breakover voltage above a first predetermined voltage, said highly doped region being of the same conductivity type as said semiconductor layer and extends from a surface of said epitaxial layer at least to said substrate.

2. The structure of claim 1 further comprising a device in said epitaxial layer for protecting said integrated circuit against voltages above a second predetermined voltage, said second predetermined voltage being less than said first predetermined voltage.

3. The structure of claim 2 further comprising an isolation region in said epitaxial layer between a) said device for protecting said integrated circuit against voltages above the second predetermined voltage and b) said highly doped region.

4. The structure of claim 3 further comprising means connecting said highly doped region to ground.

5. The structure of claim 4 further comprising conductive means in said isolation region connected to ground and means connecting said highly doped region to said conductive means.

6. The structure of claim 2 wherein said substrate is of P type conductivity, said epitaxial layer is of N− type conductivity, said highly doped region is of N+ type conductivity, and said device for protecting said integrated circuit against voltages below a predetermined voltage is a PNP transistor.

7. A structure for protecting an integrated circuit against high supply line voltages, comprising:
    a semiconductor substrate of first conductivity type;
    an epitaxial silicon layer of second conductivity type on said substrate in which at least a portion of said integrated circuit is formed together with a device for protecting said integrated circuit against voltages below a predetermined high voltage; and
    a highly doped region in said epitaxial layer, said highly doped region being of the same conductivity type as said expitaxial layer and extending at least to said substrate and being located proximate said device for protecting said integrated circuit against voltages below a predetermined high voltage;
    said highly doped region being connected to a reference potential and establishing a parasitic device including at least portions of said device for protecting said integrated circuit against voltages below a predetermined high voltage, said parasitic device having a breakover voltage above said predetermined voltage, thereby protecting said integrated circuit against voltages above said predetermined voltage.

8. The structure of claim 7 further comprising an isolation region in said epitaxial silicon layer between said device for protecting said integrated circuit against voltages below a predetermined high voltage and said highly doped region.

9. The structure of claim 7 further comprising conductive means in said isolation region connected to ground, and means connecting said highly doped region to said conductive means.

10. The structure of claim 7 wherein said substrate is P type conductivity, said device for protecting said integrated circuit against voltages below a predetermined high voltage is a PNP transistor, and said highly doped region is an N+ conductivity type region.

11. The structure of claim 7 wherein said parasitic device is an SCR device.

12. An integrated circuit having high voltage load dump protection, comprising:
   a P type substrate;
   an N− type epitaxial layer on said substrate, in which is fabricated an integrated circuit to be protected from high voltage load dumps;
   a PNP transistor in said epitaxial layer, said PNP transistor having its emitter connected to a line on which said load dump voltage appears, its collector connected to a source of potential, and its base connected to said substrate;
   a high conductivity isolation surrounding at least the lateral sides of said PNP transistor;
   an N+ region on one side of the PNP transistor in said N− type epitaxial layer connected to a reference potential to establish a parasitic NPN transistor, the base being formed by the substrate, the emitter being provided by the N+ region, and the collector being formed by the base of the PNP transistor, the parasitic NPN transistor having a breakover voltage above a predetermined threshold;
   the PNP transistor and parasitic NPN transistor comprising parts of a parasitic SCR which has a breakdown voltage above the breakdown protection voltage of said integrated circuit.

13. The integrated circuit of claim 12 wherein said N+ region is connected to ground by substrate contacts connected to it with no direct metal path to ground.

14. The integrated circuit of claim 13 wherein said N+ region is connected to ground via said high conductivity isolation region.

15. The integrated circuit of claim 12 wherein said breakdown protection voltage of said integrated circuit provided by said parasitic SCR is between 60 and 100 volts.

16. A method for protecting an integrated circuit against high supply voltages, comprising the steps of:
   providing a semiconductor substrate of first conductivity type;
   providing an epitaxial silicon layer of second conductivity type on said substrate in which said integrated circuit is formed together with a device for protecting said integrated circuit against voltages below a predetermined high voltage; and
   providing a highly doped region in said epitaxial layer having the same conductivity type as said epitaxial silicon layer, and extending at least to said substrate, and being located proximate to said device for protecting said integrated circuit against voltages below a predetermined high voltage to create a parasitic device in said substrate and epitaxial silicon layer having a breakover voltage above said predetermined voltage to protect said integrated circuit against voltages above said predetermined voltage.

17. The method of claim 16 further comprising the step of connecting said highly doped region to a reference potential, to establish a breakover voltage of said parasitic device above said predetermined voltage.

* * * * *